(12) United States Patent
Choi et al.

(10) Patent No.: US 8,969,901 B2
(45) Date of Patent: Mar. 3, 2015

(54) SEMICONDUCTOR LIGHT EMITTING DEVICE

(71) Applicant: Samsung Electronics Co., Ltd., Gyeonggi-do (KR)

(72) Inventors: Jin Young Choi, Seoul (KR); Jae Ho Han, Gyeonggi-do (KR); Ki Seok Kim, Gyeonggi-do (KR); Wan Ho Lee, Gyeonggi-do (KR); Myeong Ha Kim, Gyeonggi-do (KR); Hae Soo Ha, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/896,166

(22) Filed: May 16, 2013

(65) Prior Publication Data

US 2013/0307007 A1  Nov. 21, 2013

(30) Foreign Application Priority Data

May 17, 2012  (KR) .................. 10-2012-0052529
May 3, 2013   (KR) .................. 10-2013-0050080

(51) Int. Cl.
| | |
|---|---|
| *H01L 33/00* | (2010.01) |
| *H01L 33/40* | (2010.01) |
| *H01L 33/14* | (2010.01) |
| *H01L 33/42* | (2010.01) |

(52) U.S. Cl.
CPC .............. *H01L 33/405* (2013.01); *H01L 33/145* (2013.01); *H01L 33/42* (2013.01)
USPC .............. 257/98; 257/E33.055; 257/E33.062; 257/E33.071

(58) Field of Classification Search
CPC ....... H01L 33/36; H01L 33/38; H01L 33/405; H01L 33/42
USPC ................................................ 257/98; 438/29
See application file for complete search history.

(56) References Cited

U.S. PATENT DOCUMENTS

| | | | |
|---|---|---|---|
| 2011/0024720 A1 | 2/2011 | Chen et al. | |
| 2011/0024781 A1 | 2/2011 | Fujimoto et al. | |
| 2011/0204395 A1 | 8/2011 | Hong et al. | |
| 2013/0020599 A1* | 1/2013 | Han et al. | 257/98 |

FOREIGN PATENT DOCUMENTS

| | | |
|---|---|---|
| JP | 2004-200325 A | 7/2004 |
| JP | 2011-035017 A | 2/2011 |
| KR | 2011-0097011 A | 8/2011 |

\* cited by examiner

*Primary Examiner* — Daniel Whalen
(74) *Attorney, Agent, or Firm* — McDermott Will & Emery LLP

(57) ABSTRACT

A light emitting device includes a first semiconductor layer, an active layer, and a second semiconductor layer, and first and second electrodes electrically connected to the first and second semiconductor layers, respectively. The second electrode includes a reflective pad portion, a transparent electrode layer, a reflective finger portion and an electrode pad portion. The reflective pad portion is disposed in a region of an upper surface of the second semiconductor layer. The transparent electrode layer is disposed on the second semiconductor layer and has an opening encompassing the reflective pad portion such that the transparent electrode layer is not in contact with the reflective pad portion. The reflective finger portion extends from the reflective pad portion and has at least a portion thereof disposed on the transparent electrode layer. The electrode pad portion covers the reflective pad portion to be in contact with the transparent electrode layer.

8 Claims, 15 Drawing Sheets

SEMICONDUCTOR LIGHT EMITTING DEVICE

CROSS-REFERENCE TO RELATED APPLICATIONS

This application claims benefit of priority to Korean Patent Application Nos. 10-2012-0052529 filed on May 17, 2012 and 10-2013-0050080 filed on May 3, 2013 in the Korean Intellectual Property Office, the entire contents of which are hereby incorporated by reference.

TECHNICAL FIELD

The present inventive concept relates to a semiconductor light emitting device and a lighting device including the semiconductor light emitting device.

BACKGROUND

A light emitting diode (LED) is a device including a material emitting light when electrical energy is applied thereto, in which energy generated through electron-hole recombination in semiconductor junction parts is converted into light to be emitted therefrom. LEDs are commonly employed as light sources in illumination devices, display devices, and the like, and thus, the development of LEDs has been accelerated.

In particular, as the development and employment of gallium nitride (GaN)-based LEDs have recently increased, and mobile keypads, turn signal lamps, camera flashes, and the like, using such gallium nitride-based LEDs, have been commercialized, and, in line with this, the development of general illumination devices using LEDs has accelerated. Like the products to which light emitting devices are applied, such as the backlight units of large TVs, the headlamps of vehicles, a general illumination device, and the like, the purposes of light emitting devices are gradually moving toward large-sized products having high outputs and high degrees of efficiency, so a method for enhancing light extraction efficiency of a light emitting device used for the purposes is required.

SUMMARY

An aspect of the present inventive concept relates to a semiconductor light emitting device having enhanced light extraction efficiency.

One aspect of the present inventive concept encompasses a semiconductor light emitting device including a light emitting structure and first and second electrodes. The light emitting structure includes a first conductivity-type semiconductor layer, an active layer, and a second conductivity-type semiconductor layer sequentially laminated therein. The first and second electrodes are electrically connected to the first and second conductivity-type semiconductor layers, respectively. The second electrode includes a reflective pad portion disposed in a region of an upper surface of the second conductivity-type semiconductor layer, a transparent electrode layer disposed on the second conductivity-type semiconductor layer and having an opening encompassing the reflective pad portion such that the transparent electrode layer is not in contact with the reflective pad portion, a reflective finger portion extending from the reflective pad portion and having at least a portion thereof disposed on the transparent electrode layer, an electrode pad portion covering the reflective pad portion and disposed to be in contact with the transparent electrode layer, and an electrode finger portion covering the reflective finger portion and disposed to be in contact with the transparent electrode layer.

A current blocking layer may be disposed in a region of an upper surface of the second conductivity-type semiconductor layer corresponding to lower portions of the electrode pad portion and the electrode finger portion.

The current blocking layer may include at least one selected from the group consisting of $SiO_2$, $SiO_xN_y$, $Si_xN_y$, and $Al_2O_3$.

The reflective pad portion may be spaced apart from an edge of the opening by a predetermined interval.

The reflective portion may include at least one selected from aluminum (Al), silver (Ag), platinum (Pt), rhodium (Rh), ruthenium (Ru), nickel (Ni), palladium (Pd), iridium (Ir), manganese (Mg), zinc (Zn), and gold (Au).

The transparent electrode layer may include at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (zinc magnesium oxide, $0 \leq x \leq 1$).

The electrode pad portion and the electrode finger portion may include at least one selected from gold (Au), aluminum (Al), and silver (Ag).

A metal layer may be disposed at an interface between the reflective finger portion and the transparent electrode layer.

Another aspect of the present inventive concept relates to a semiconductor light emitting device including a light emitting structure and first and second electrodes. The light emitting structure includes a first conductivity-type semiconductor layer, an active layer, and a second conductivity-type semiconductor layer sequentially laminated therein. The first and second electrodes are electrically connected to the first and second conductivity-type semiconductor layers, respectively. At least one of the first and second electrodes includes a reflective portion having a protrusion disposed on a portion of a lateral side of the reflective portion, and a transparent electrode layer including an opening encompassing the reflective portion such that the transparent electrode layer is not in contact with the reflective portion. An inner circumferential surface of the transparent electrode layer defining the opening has an intaglio pattern having a shape corresponding to a shape of the protrusion.

The semiconductor light emitting device may further include: an electrode pad portion filling the opening to cover the reflective portion and having a region in contact with the transparent electrode layer.

The intaglio pattern having the shape corresponding to the shape of the protrusion may be repeatedly disposed on the inner circumferential surface of the opening and spaced apart from one another by a predetermined interval.

The protrusion may be disposed on a side of the reflective portion and may include a plurality of protrusions each having a trapezoidal shape, a saw tooth shape, a quadrangular shape, or a sine wave shape.

The protrusions of the reflective portion may be radially disposed.

The protrusions may be repeatedly disposed with a predetermined angle therebetween with respect to a central portion of the reflective portion.

The electrode pad portion may have fingers disposed in regions corresponding to the protrusions. Still another aspect of the present inventive concept encompasses a light device including a semiconductor light emitting device, and a housing including a heat dissipation plate in contact with the semiconductor light emitting device. The semiconductor light emitting device includes a light emitting structure and first and second electrodes. The light emitting structure includes a first conductivity-type semiconductor layer, an active layer, and a second conductivity-type semiconductor layer sequentially laminated therein. The first and second electrodes are electrically connected to the first and second conductivity-type semiconductor layers, respectively. The second electrode includes a reflective pad portion disposed in a region of an upper surface of the second conductivity-type semiconductor layer, a transparent electrode layer disposed on the second conductivity-type semiconductor layer and having an opening encompassing the reflective pad portion such that the transparent electrode layer is not in contact with the reflective pad portion, a reflective finger portion extending from the reflective pad portion and having at least a portion thereof disposed on the transparent electrode layer, an electrode pad portion covering the reflective pad portion and disposed to be in contact with the transparent electrode layer, and an electrode finger portion covering the reflective finger portion and disposed to be in contact with the transparent electrode layer.

The light device may further include a plurality of heat dissipation fins configured to dissipate heat from the heat dissipation plate to the air.

BRIEF DESCRIPTION OF THE DRAWINGS

The above and other aspects, features and other advantages of the present inventive concept will be more clearly understood from the following detailed description taken in conjunction with the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Figure 1:
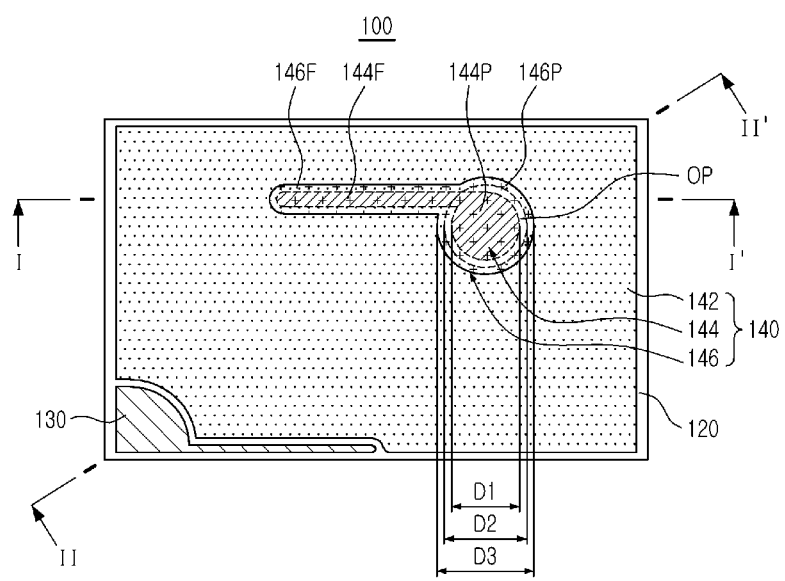
FIG. 1 is a plan view of a semiconductor light emitting device according to an embodiment of the present inventive concept.

Embodiments of the present inventive concept will now be described in detail with reference to the accompanying drawings. The present inventive concept may, however, be embodied in many different forms and should not be construed as being limited to the embodiments set forth herein. Rather, these embodiments are provided so that this disclosure will be thorough and complete, and will fully convey the scope of the present inventive concept to those skilled in the art. In the drawings, the shapes and dimensions of elements may be exaggerated for clarity, and the same reference numerals will be used throughout to designate the same or like components.

Figure 2:
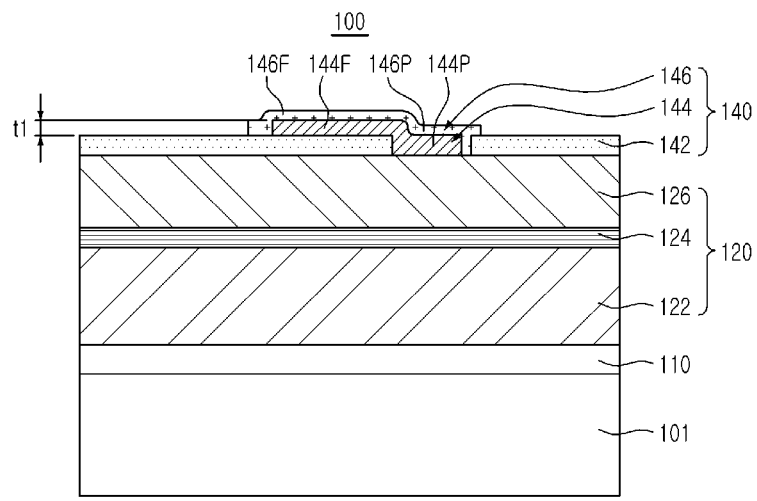
FIG. 2 is a cross-sectional view of the semiconductor light emitting device of FIG. 1, taken along line I-I'.
Figure 3:
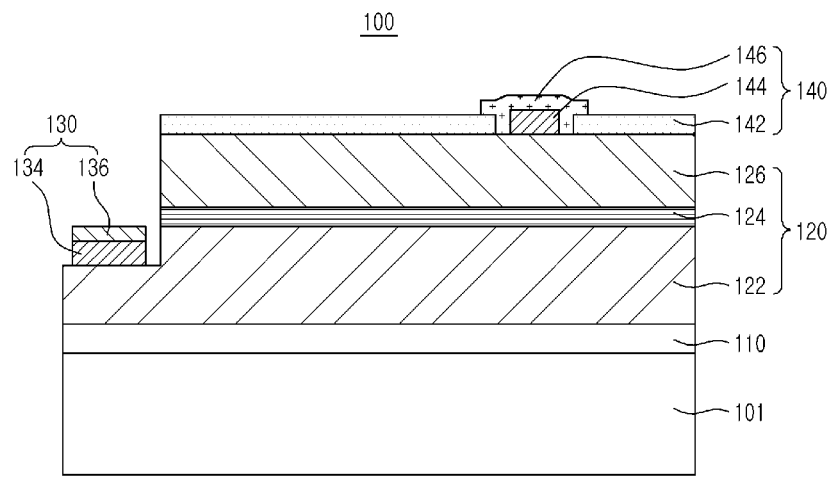
FIG. 3 is a cross-sectional view of the semiconductor light emitting device of FIG. 1, taken along line II-II'.
Figure 4:
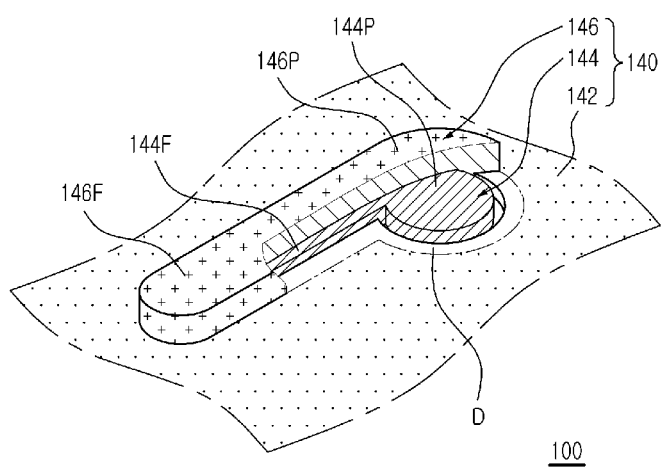
FIG. 4 is a perspective view illustrating a particular cutaway second electrode unit of FIG. 1.

FIG. 1 is a plan view of a semiconductor light emitting device according to an embodiment of the present inventive concept. FIG. 2 is a cross-sectional view of the semiconductor light emitting device of FIG. 1, taken along line I-I'. FIG. 3 is a cross-sectional view of the semiconductor light emitting device of FIG. 1, taken along line FIG. 4 is a perspective view illustrating a particular cutaway second electrode unit of FIG. 1.

Referring to FIGS. 1 through 4, a semiconductor light emitting device 100 according to an embodiment of the present inventive concept may include a light emitting structure 120 and first and second electrodes 130 and 140.

The light emitting structure 120 may include first and second conductivity-type semiconductor layers 122 and 126 and an active layer 124. When power is applied to the first and second conductivity-type semiconductor layers 122 and 126, light is emitted from the active layer 124.

In detail, the light emitting structure 120 may be a nitride semiconductor layer. The first conductivity-type semiconductor layer 122 may include an n-type semiconductor layer and the second conductivity-type semiconductor layer 126 may include a p-type semiconductor layer.

The n-type semiconductor layer and the p-type semiconductor layer may be made of a semiconductive material doped with an n-type impurity and a p-type impurity having an empirical formula $Al_xIn_yGa_{(1-x-y)}N$, respectively. The semiconductive material may be, GaN, AlGaN, or InGaN. Here, the x and y values may be within the range of $0 \leq x \leq 1$, $0 \leq y \leq 1$ and $0 \leq x+y \leq 1$.

Silicon (Si), germanium (Ge), selenium (Se), tellurium (Te), carbon (C), and the like, may be used as the n-type impurity, and manganese (Mg), zinc (Zn), beryllium (Be), and the like, may be typical p-type impurities.

In an embodiment of the present inventive concept, GaN layers may be used as the first and second conductivity-type semiconductor layers 122 and 126, and in this case, an n-GaN layer may be used as the first conductivity-type semiconductor layer 122 and a p-GaN layer may be used as the second conductivity-type semiconductor layer 126.

The light emitting structure 120 may be grown through metal-organic chemical vapor deposition (MOCVD), molecular beam epitaxy (MBE), hydride vapor phase epitaxy (HVPE), or the like, on a substrate 101. As the substrate 101, any one of sapphire, silicon carbide (SiC), silicon (Si), $MgAl_2O_4$, MgO, $LiAlO_2$, $LiGaO_2$, and GaN substrates may be used, but the present inventive concept is not limited thereto. In an embodiment of the present inventive concept, a sapphire substrate may be used.

Sapphire may be a crystal having Hexa-Rhombo R3c symmetry, of which lattice constants in c-axial and a-axial directions may be approximately 13.001 Å and 4.758 Å, respectively, and may have a C-plane (0001), an A-plane (1120), an R-plane (1102), and the like. In this case, a nitride thin film may be relatively easily grown on the C-plane of sapphire crystal, and because sapphire crystal is stable at high temperatures, a sapphire substrate is commonly used as a nitride growth substrate.

Also, a buffer layer 110 may be formed below the first conductivity-type semiconductor layer 122.

The buffer layer 110, serving to mitigate a lattice defect in the light emitting structure 120 grown on the substrate 110, may be formed as an undoped semiconductor layer made of a nitride, or the like. For example, the buffer layer 110 may mitigate a difference in lattice constants between the sapphire substrate used as the substrate 101 and the light emitting structure 120 made of GaN and laminated thereon to increase the crystallinity of the GaN layer. In this case, undoped GaN, AlN, InGaN, or the like, may be applied to the buffer layer 110, and the buffer layer 110 may be grown to have a thickness ranging from tens to hundreds of Å at a low temperature ranging from 500° C. to 600° C. Here, the term "undoped" may refer to a semiconductor layer which has not been subjected to an impurity doping process. The undoped semiconductor layer may have an inherent level of impurity concentration. For example, when a gallium nitride semiconductor is grown by using MOCVD, silicon (Si) or the like, used as a dopant, may be included in an amount ranging from about $10^{14}$/cm$^3$ to $10^{18}$/cm$^3$ therein, although not intended.

The active layer 124 may be a layer for emitting visible light (having a wavelength range from about 350 nm to 680 nm) and may be configured as an undoped nitride semiconductor layer having a single quantum well (SQW) or a multi-quantum well (MQW) structure. The active layer 124 may have a multi-quantum well (MQW) structure in which quantum barrier layers and quantum well layers are alternately laminated. For example, the active layer 124 may have an MQW structure in which $Al_xIn_yGa_{(1-x-y)}N$ (0≤x≤1, 0≤y≤1, 0≤x+y≤1) quantum barrier layers and quantum well layers are alternately laminated to have a predetermined band gap, and electrons and holes may be recombined by the quantum wells to emit light.

The first and second electrodes 130 and 140 may be formed on the first and second conductivity-type semiconductor layers 122 and 126, respectively. The first and second electrodes 130 and 140 may be electrically connected to the first and second conductivity-type semiconductor layers 122 and 126, respectively, such that light is emitted from the active layer 124 of the light emitting structure 120 when power is applied thereto.

Also, the first and second electrodes 130 and 140 may be provided as regions in contact with conductive wires, solder bumps, or the like, for the application of an external electrical signal. The first electrode 130 may be formed on a portion of an upper surface of the first conductivity-type semiconductor layer 122 exposed as portions of the active layer 124 and the second conductivity-type semiconductor layer 126 of the light emitting structure 120 are removed. The second electrode 140 may be formed on the second conductivity-type semiconductor layer 126. Also, the first electrode 130 may include an electrode pad portion 136 and a reflective pad portion 134.

The second electrode 140 may include a transparent electrode layer 142, a reflective portion 144, and an electrode portion 146.

The transparent electrode layer 142, as a current spreading layer, may be formed on an upper surface of the second conductivity-type semiconductor layer 126. The transparent electrode layer 142 may be formed as a transparent conductive oxide layer and may be made of at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (zinc magnesium oxide, 0≤x≤1).

An opening OP (see FIG. 1) may be formed in at least a region of the transparent electrode layer 142, and a reflective pad portion 144P of the reflective portion 144 may be formed on an upper surface of the second conductivity-type semiconductor layer exposed from the opening OP. The opening OP may have a circular shape when viewed from above (see FIG. 1), but the present inventive concept is not limited thereto and the opening OP may have various other shapes.

The reflective portion 144 may include the reflective pad portion 144P and a reflective finger portion 144F. The reflective portion 144 may be formed below an electrode pad portion 146P and an electrode finger portion 146F to reflect light emitted from the active layer 124 such that light is not absorbed. The reflective portion 144 may be processed to have a smooth surface to improve surface reflectivity. The reflective portion 144 may be made of at least one selected from aluminum (Al), silver (Ag), platinum (Pt), rhodium (Rh), ruthenium (Ru), nickel (Ni), palladium (Pd), iridium (Ir), manganese (Mg), zinc (Zn), and gold (Au). Also, the reflective portion 144 may have a thickness t1 (see FIG. 2) of approximately 2000 Å. Also, titanium (Ti) may be deposited on an upper portion of the reflective portion 144 to prevent oxidation of the reflective portion 144.

The reflective pad portion 144P may be formed within the opening OP of the transparent electrode layer 142 such that the reflective pad portion 144P is spaced from a lateral surface of the opening OP by a predetermined interval. If the reflective pad portion 144P and the transparent electrode layer 142 are in contact, the transparent electrode layer 142 may be discolored to degrade external light extraction efficiency of light emitted from the active layer 124. Thus, the reflective pad portion 144P may be formed within the opening OP such that the reflective pad portion 144P is not in contact with the transparent electrode layer 142.

The reflective finger portion 144F may extend from the reflective pad portion 144P, and at least a portion of the reflective finger portion 144F may be formed on the transparent electrode layer 142. The reflective finger portion 144F may be formed to be long and narrow, relative to the reflective pad portion 144P to have a shape advantageous for improving a current flow. Since the reflective finger portion 144F may be formed to be long and narrow, relative to the reflective pad portion 144P, even in the case that the reflective finger portion 144F is in contact with the transparent electrode layer 142 to discolor the transparent electrode layer 142, an influence thereof on external light extraction efficiency may be relatively small. However, in order to prevent the transparent electrode layer 142 from being in contact with the reflective finger portion 144F so as to be discolored, an interface between the transparent electrode layer 142 and the reflective finger portion 144F may be provided with a metal layer that blocks reaction between the transparent electrode layer 142 and the reflective finger portion 144F.

The electrode portion 146 may cover the reflective portion 144 and have a region D in contact with the transparent electrode layer 142. The electrode portion 146 may be made of at least one selected from conductive materials such as gold (Au), aluminum (Al), silver (Ag), or the like, and may have a multi-layer structure. Like the reflective portion 144, the electrode portion 146 may include the electrode pad portion 146P and the electrode finger portion 146F, formed on the reflective portion 144P and the reflective finger portion 144F, respectively.

An embodiment of the opening OP of the transparent electrode layer 142, the reflective portion 144, and the electrode portion 146 will be described in detail with reference to FIG. 1. The opening OP of the transparent electrode layer 142 may have a circular shape having a diameter D2, and the reflective pad portion 144P may have a circular shape having a diameter D1 smaller than the diameter D2. The reflective finger portion 144F may have a narrow, long shape, relative to the reflective pad portion 144P. One end of the reflective finger portion 144F may extend to the reflective pad portion 144P, and the other end of the reflective finger portion 144F may be disposed on the transparent electrode layer 142.

Also, the electrode pad portion 146P may have a diameter D3 greater than the diameter D2 of the opening OP to cover the opening OP, and the electrode finger portion 146F extending from the electrode pad portion 146P may be narrow and long, relative to the electrode pad portion 146P to cover the reflective finger portion 144P.

In the semiconductor light emitting device 100 having the foregoing configuration, since the reflective portion 144 may be disposed below the electrode portion 146, light which would otherwise be absorbed by the electrode portion 146 may be reflected, enhancing external light extraction efficiency. In particular, since the reflective finger portion 144F may be disposed below the electrode finger portion 146F, external light extraction efficiency may be further enhanced. Referring to experiment data of Table 1, it can be seen that reflective portion embodiments in which the reflective portion 144 is formed have an effect of enhancing a quantity of light by approximately 2% to 4%, in comparison to comparative examples (Ref). In table 1, the results of luminous flux ratio (simulation) were obtained based on computer simulation, and the results of luminous flux ratio (actual measurement) were obtained by performing measurements on the actually manufactured semiconductor light emitting devices.

Figure 5:
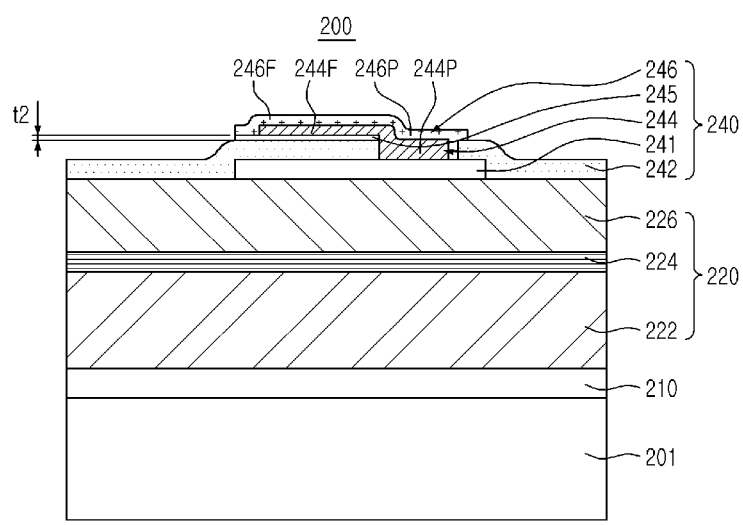
FIG. 5 is a view illustrating a modification of the semiconductor light emitting device of FIG. 1.

FIG. 5 is a view illustrating a modification of the semiconductor light emitting device 100 of FIG. 1. A semiconductor light emitting device 200 may further include a current blocking layer 241 formed in a region of an upper surface of a second conductivity-type semiconductor layer 226 corresponding to lower portions of an electrode pad portion 246P and an electrode finger portion 246F and a metal layer 244 formed on an interface between a transparent electrode layer 242 and a reflective finger portion 244F. With the current blocking layer 241, a current introduced from the electrode pad portion 246P and the electrode finger portion 246F may be interrupted by the current blocking layer 241 so as to be dispersed, mitigating concentration of the current on the lower portions of the electrode pad portion 246P and the electrode finger portion 246F. The current blocking layer 241 may be formed of a transparent insulating material selected from $SiO_2$, $SiO_xN_y$, $Si_xN_y$, and $Al_2O_3$.

As described above, the metal layer 244 may be provided in order to prevent the transparent electrode layer 242 from being in contact with the reflective finger portion 244F to prevent discoloration of the transparent electrode layer 242. The metal layer 244 may be formed of a metal having low reactivity such as Cr, Ti, Ni, and the like, and may have a thickness t2 ranging from about 5 Å to 50 Å, so that the absorption of light may be minimized.

Figure 10:
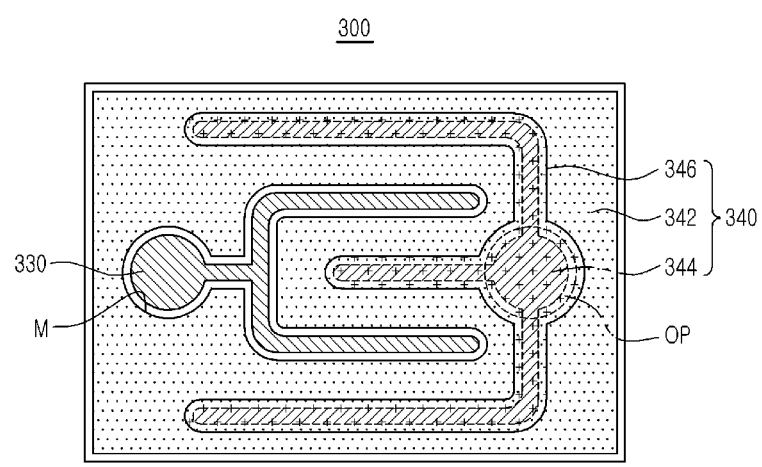
FIG. 10 is a plan view of a semiconductor light emitting device according to another embodiment of the present inventive concept.

FIG. 10 is a view illustrating a semiconductor light emitting device 300 according to another embodiment of the present inventive concept. In the semiconductor light emitting device 300 of FIG. 10, a first electrode 330 may be disposed in a central portion thereof, a plurality of fingers may extend from the first electrode 330 and a second electrode 340. Thus, in comparison to the semiconductor light emitting device illustrated in FIG. 1, the semiconductor light emitting device illustrated in FIG. 10 may be more advantageous for spreading a current. The second electrode 340 may includes a transparent electrode layer 342, a reflective portion 344, and an electrode portion 346.

Figure 11:
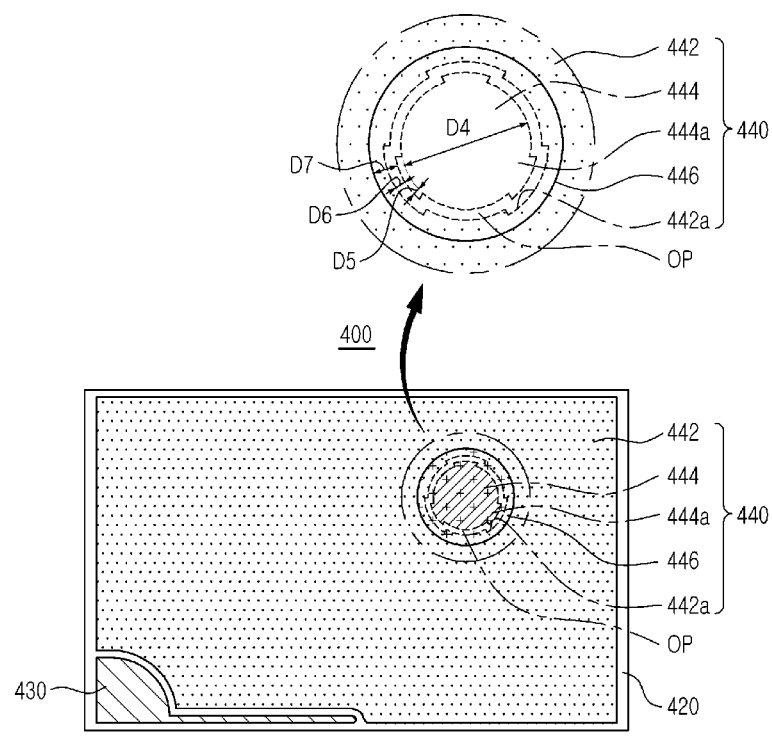
FIG. 11 is a plan view of a semiconductor light emitting device according to another embodiment of the present inventive concept.

FIG. 11 is a plan view of a semiconductor light emitting device 400 according to another embodiment of the present inventive concept.

The semiconductor light emitting device 400 according to an embodiment of the present inventive concept may have the same components as those of the foregoing embodiments as described above, except for a structure of a second electrode 440. Thus, components different from those of the foregoing embodiments will be largely described hereinafter.

As illustrated in FIG. 11, a semiconductor light emitting device 400 according to another embodiment of the present inventive concept may include the first and second conductivity-type semiconductor layers 122 and 126, the active layer

TABLE 1

|  | PKG1 | | PKG2 | | PKG3 | | PKG4 | |
| --- | --- | --- | --- | --- | --- | --- | --- | --- |
|  | Ref. | Reflective portion | Ref. | Reflective portion | Ref. | Reflective portion | Ref. | Reflective portion |
| Luminous flux ratio (Simulation) | 100.00% | 102.62% | 100.00% | 103.84% | 100.00% | 101.25% | 100.00% | 103.46% |
| Luminous flux ratio (Actual measurement) |  | 104.40% |  | 102.90% |  | 101.00% |  | 101.50% |

124, which may be the same as those of the foregoing embodiments, and a first electrode 430, and may also include a reflective portion 444 having a protrusion 444a and a transparent electrode layer 420 having an intaglio pattern 442a corresponding to the protrusion 444a.

An opening OP may be formed in at least a region of a transparent electrode layer 442, and the reflective portion 444 may be formed in the opening OP.

The protrusion 444a may be formed on the circumference of the reflective portion 444, and the reflective portion 444 may be processed to have a smooth surface to enhance surface reflectivity. The reflective portion 444 may be made of at least one selected from aluminum (Al), silver (Ag), platinum (Pt), rhodium (Rh), ruthenium (Ru), nickel (Ni), palladium (Pd), iridium (Ir), manganese (Mg), zinc (Zn), and gold (Au).

The protrusion 444a may extend from a side of the reflective portion 444. The protrusion 444a may be formed to be in contact with the second conductivity-type semiconductor layer 126 exposed in the opening OP and may have various shapes.

Figure 13A:
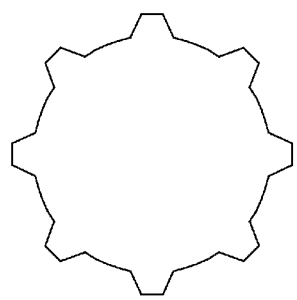
FIGS. 13A to 13C are views illustrating modifications of a reflective portion of the semiconductor light emitting device of FIG. 11.
Figure 13B:
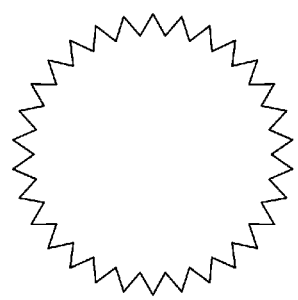
Figure 13C:
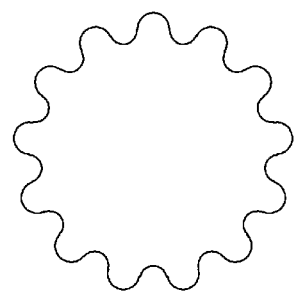

Here, the protrusion 444a may be repeatedly formed at predetermined angles with respect to a central portion of the reflective portion 444. In detail, as illustrated in FIG. 11, the protrusion 444a may be repeatedly formed with an angle of 120° therebetween with respect to the central portion of the reflective portion 444. Also, as illustrated in FIGS. 13A-13C, a protrusion having a trapezoidal shape may be repeatedly formed (see FIG. 13A), a protrusion having a saw tooth shape may be repeatedly formed (see FIG. 13B), or a protrusion having a sine wave shape may be repeatedly formed (see FIG. 13C).

As described above, when the reflective portion 444 is formed to be in contact with the transparent electrode layer 442, the transparent electrode layer 442 may be discolored to degrade light transmission, so the reflective portion 444 may be formed to be spaced apart from the transparent electrode layer 442.

Here, referring to FIG. 11, if a space D6 between the reflective portion 444 and the transparent electrode layer 442 is too large, a region in which an electrode portion 446 covers the reflective portion 444 and the transparent electrode 442 may be increased to reduce a light emitting region of the semiconductor light emitting device 400.

Meanwhile, if the space D6 between the reflective portion 444 and the transparent electrode layer 442 is too narrow, the reflective portion 444 and the transparent electrode layer 442 may be in contact due to an error in a manufacturing process. Thus, the reflective portion 444 and the transparent electrode layer 442 may be formed to have an appropriate space therebetween. In an embodiment of the present inventive concept, the reflective portion 444 and the transparent electrode layer 442 may be formed to be spaced apart from one another by an interval ranging from 3 μm to 6 μm. The transparent electrode layer 442 may have the opening OP encompassing the reflective portion 444 such that the transparent electrode layer 442 is not in contact with the reflective portion 444. An inner circumferential surface of the transparent electrode layer 442 of the opening OP may have the intaglio pattern 442a having a shape corresponding to a shape of the protrusion 444a.

The electrode portion 446 may be formed in the opening OP of the transparent electrode layer 442 such that the electrode portion 446 covers the reflective portion 444. The electrode portion 446 may fill the opening OP such that the electrode portion 446 has a region in contact with the transparent electrode layer 442.

The electrode portion 446 may be made of at least one selected from gold (Au), aluminum (Al), and silver (Ag).

In the semiconductor light emitting device 400, since the reflective portion 444 having a relatively large area may be formed below the limited electrode portion 446, light extraction efficiency can be enhanced in comparison to an existing semiconductor light emitting device.

In detail, referring to FIG. 11, a reflective portion having a diameter D4 equal to 85 μm may be formed below the electrode portion of the existing semiconductor light emitting device, while, in the case of an embodiment of the present inventive concept, the protrusion 444a having a width D5 equal to 6 μm, relative to the related art reflective portion, may further be formed.

Thus, in comparison to the existing reflective portion having an area of approximately 65% of the area of the electrode portion, the electrode portion 446 according to an embodiment of the present inventive concept may have the reflective portion 444 corresponding to an area ranging from 80% to 90% of the second electrode portion 440. Namely, the area of the reflective portion 444 is greater. In addition, a region D7 in which light emitted from the active layer would otherwise be absorbed by the electrode portion 446, without being emitted externally, may be reduced.

In general, the electrode portion 446 of the second electrode 440 is disposed to have a limited area in order to secure a light emitting region. Thus, if the reflective portion 444 formed below the electrode portion 446 is excessively increased in size, an area in which the transparent electrode layer 442 and the electrode portion 446 are in contact is reduced, thereby reducing an amount of current.

In an embodiment of the present inventive concept, the reflective portion 444 may include the protrusion 444a, whereby the reflective portion 444 having an increased area may be formed below the electrode portion 446 having a limited area, while a reduction in the area in which the electrode portion 446 and the transparent electrode layer 442 are in contact may be mitigated. As a result, a reduction in the amount of current may be mitigated.

Thus, in an embodiment of the present inventive concept, light output is enhanced relative to existing semiconductor light emitting devices. Specifically, in comparison to existing semiconductor light emitting devices, approximately 1% of light output can be enhanced.

Also, in an embodiment of the present inventive concept, due to the presence of the protrusion 444a, a contact area between the second conductivity-type semiconductor layer of the light emitting structure 420 and the reflective portion 444 may be increased. Thus, the reflective portion 444 can be further firmly attached to the second conductivity-type semiconductor layer. Thus, a phenomenon in which the reflective portion 444 is delaminated from the surface of the second conductivity-type semiconductor layer so as to be separated may be reduced.

Also, since the contact area between the reflective portion 444 and the electrode portion 446 is increased, bonding strength therebetween can be further increased, reducing separation of the reflective portion 444 and the electrode portion 446.

Figure 12:
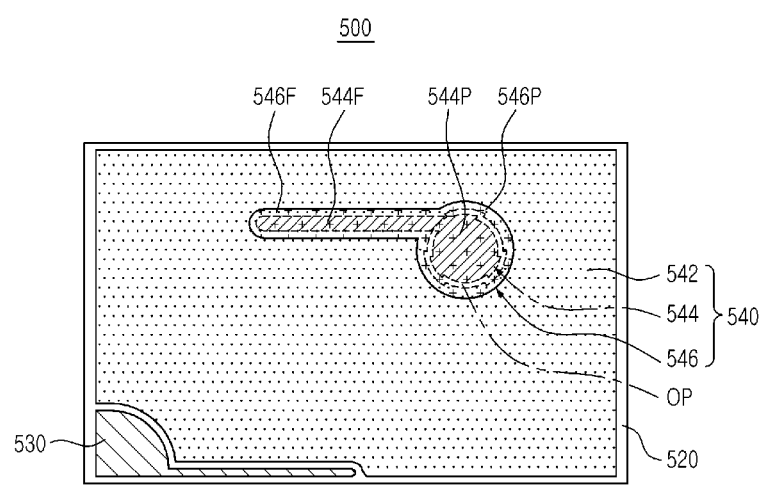
FIG. 12 is a view illustrating a modification of the semiconductor light emitting device of FIG. 11.

FIG. 12 is a view illustrating a modification of the semiconductor light emitting device of FIG. 11. Referring to FIG. 12, a semiconductor light emitting device 500 according to an embodiment of the present inventive concept may include a light emitting structure 520 and first and second electrodes 530 and 540. The reflective portion 544 may include the reflective pad portion 544P and a reflective finger portion 544F. The reflective portion 544 may be formed below an electrode pad portion 546P and an electrode finger portion 546F to reflect light emitted from the active layer 524 such that light is not absorbed. Like the reflective portion 544, the electrode portion 546 may include the electrode pad portion 546P and the electrode finger portion 546F, formed on the reflective portion 544P and the reflective finger portion 544F, respectively. The reflective finger portion 544F may extend from the reflective pad portion 544P, and at least a portion of the reflective finger portion 544F may be formed on the transparent electrode layer 542.

A method for manufacturing the semiconductor light emitting device 200 illustrated in FIG. 5 will be described with reference to FIGS. 6 through 9.

FIGS. 6A, 7A, 8A, and 9A are cross-sectional views sequentially illustrating a process of fabricating the semiconductor light emitting device of FIG. 5 along line I-I'. FIGS. 6B, 7B, 8B, and 9B are cross-sectional views sequentially illustrating a process of fabricating the semiconductor light emitting device of FIG. 5 along line II-II'.

Figure 6A:
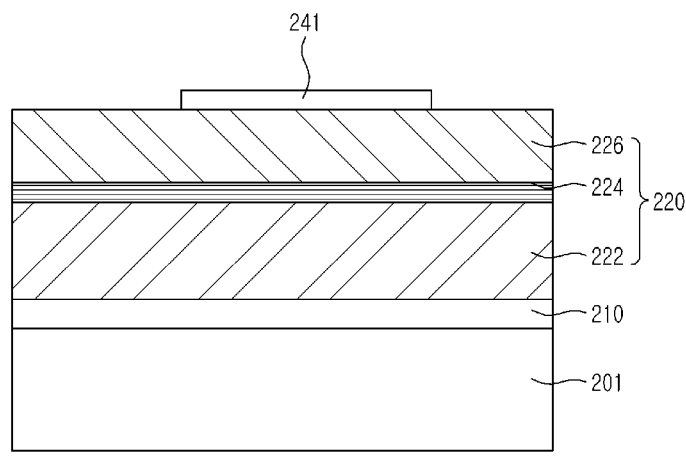
FIGS. 6A, 7A, 8A, and 9A are cross-sectional views sequentially illustrating a process of fabricating the semiconductor light emitting device of FIG. 5 along line I-I'.
Figure 6B:
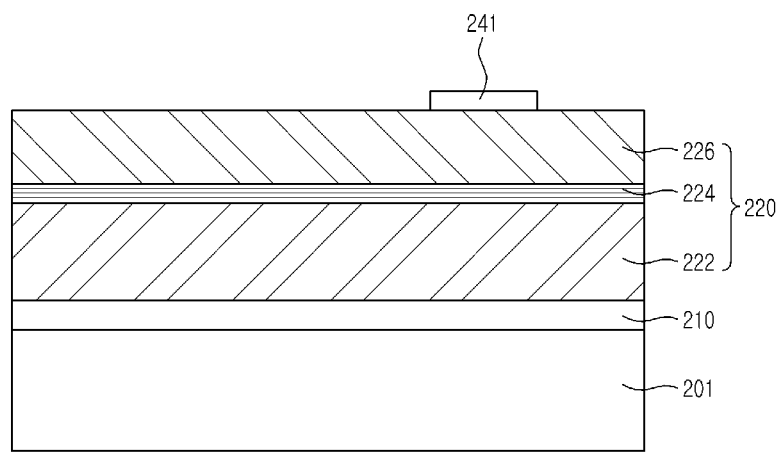
FIGS. 6B, 7B, 8B, and 9B are cross-sectional views sequentially illustrating a process of fabricating the semiconductor light emitting device of FIG. 5 along line II-II'.

First, as illustrated in FIGS. 6A and 6B, a buffer layer 210, a light emitting structure 220, and the current blocking layer 241 are formed on a prepared substrate 201. The buffer layer 210 may be omitted according to circumstances. A light emitting structure 220 including first and second conductivity-type semiconductor layers 222 and 226 and an active layer 224 interposed therebetween may be formed on the buffer layer 210.

The light emitting structure 220 may be grown through metal-organic chemical vapor deposition (MOCVD), molecular beam epitaxy (MBE), hydride vapor phase epitaxy (HVPE), or the like.

The current blocking layer 241 may be formed in a region of the second conductivity-type semiconductor layer 226 in which a second electrode is to be formed. The current blocking layer 241 may be formed as an insulative material and, in an embodiment of the present inventive concept, the current blocking layer 241 may be made of $SiO_2$.

Figure 7A:
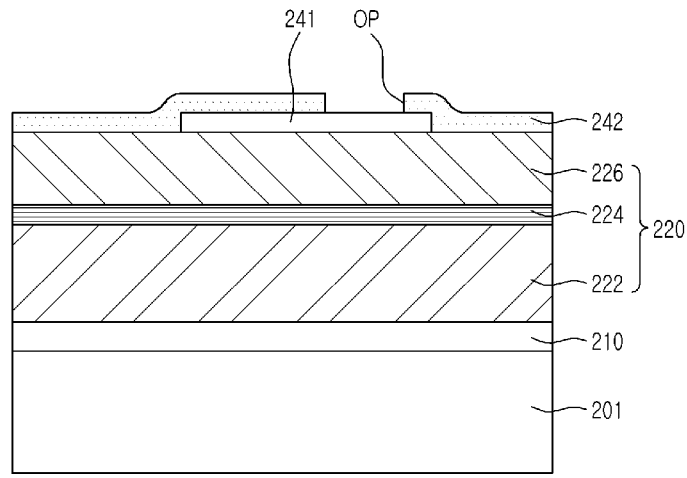
Figure 7B:
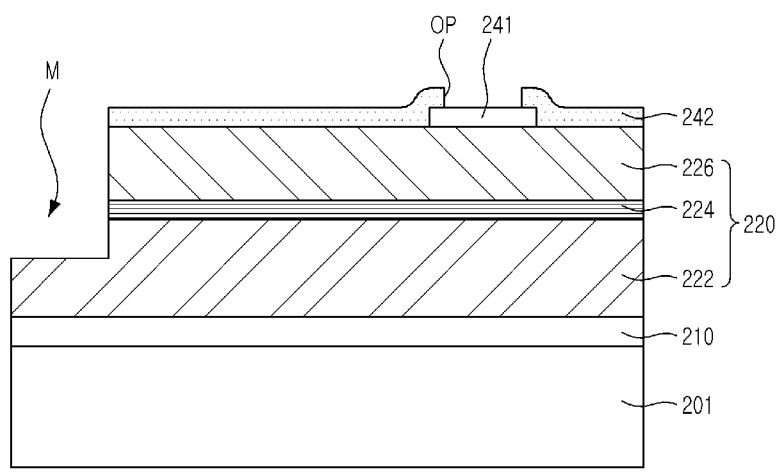

Next, as illustrated in FIGS. 7A and 7B, a transparent electrode layer 242 may be formed on the second conductivity-type semiconductor layer 226 such that the transparent electrode layer 242 covers the current blocking layer 241, and an opening OP may be formed in a position of the transparent electrode layer 242 in which a second electrode 240 is to be formed. Also, the transparent electrode layer 242, the second conductivity-type semiconductor layer 226, and the active layer 224 may be etched to form a mesa surface M.

Figure 8A:
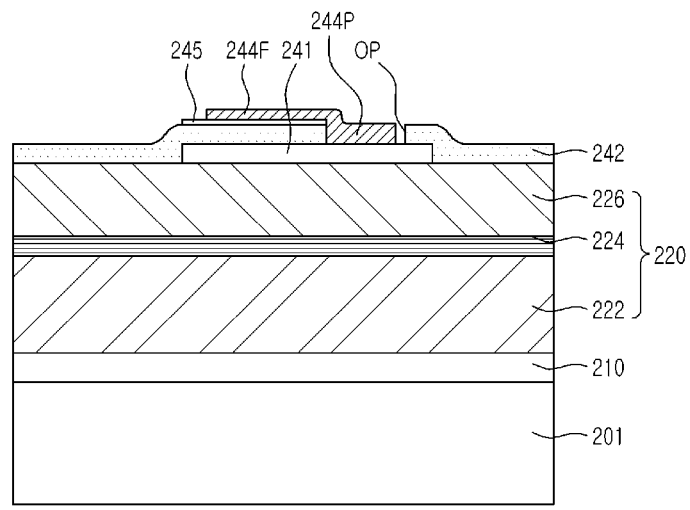
Figure 8B:
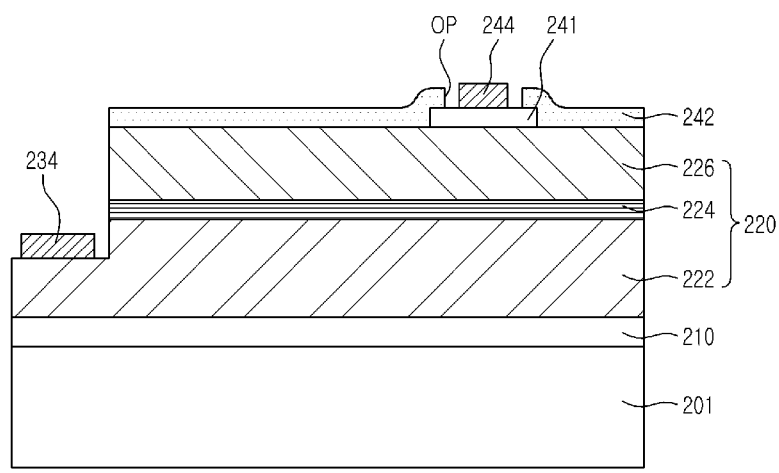

Thereafter, as illustrated in FIGS. 8A and 8B, a reflective pad portion 234 (also see FIG. 5) may be formed on the first conductivity-type semiconductor layer 222 exposed by the mesa surface M, and a reflective pad portion 244P (also see FIG. 5) may be formed in the opening OP. The reflective pad portion 244P may be formed in the opening OP of the transparent electrode layer 242. In this case, if the reflective pad portion 244P and the transparent electrode layer 242 are in contact, the transparent electrode layer 242 may be discolored to degrade external light extraction efficiency of light emitted from the active layer 224, so the reflective pad portion 244P may be formed within the opening OP such that the reflective pad portion 244P is not in contact with the transparent electrode layer 242.

One end of the reflective finger portion 244F may extend from the reflective pad portion 244P, and a portion of the reflective finger portion 244F may be formed on the transparent electrode layer 242. In this case, as mentioned above, if the reflective finger portion 244F and the transparent electrode layer 242 are in contact, the transparent electrode layer 242 may be discolored. Thus, a metal layer 245 may be formed on the interface between the reflective finger portion 244F and the transparent electrode layer 242 to prevent discoloration of the transparent electrode layer 242. Specifically, the metal layer 245 may have a thickness ranging from about 5 Å to 50 Å.

Figure 9A:
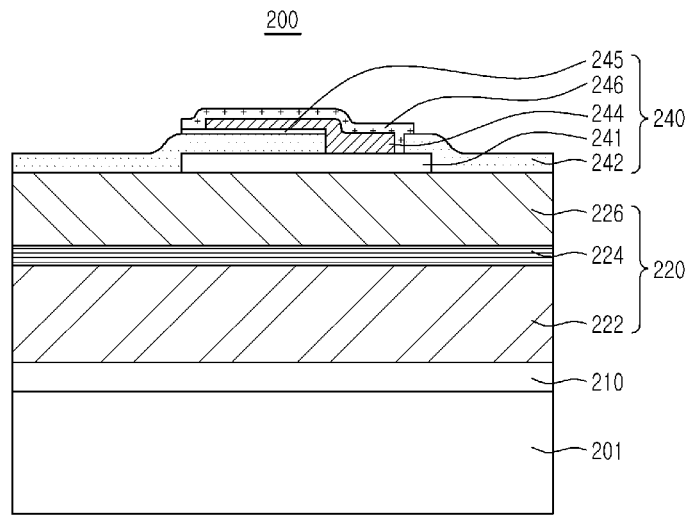
Figure 9B:
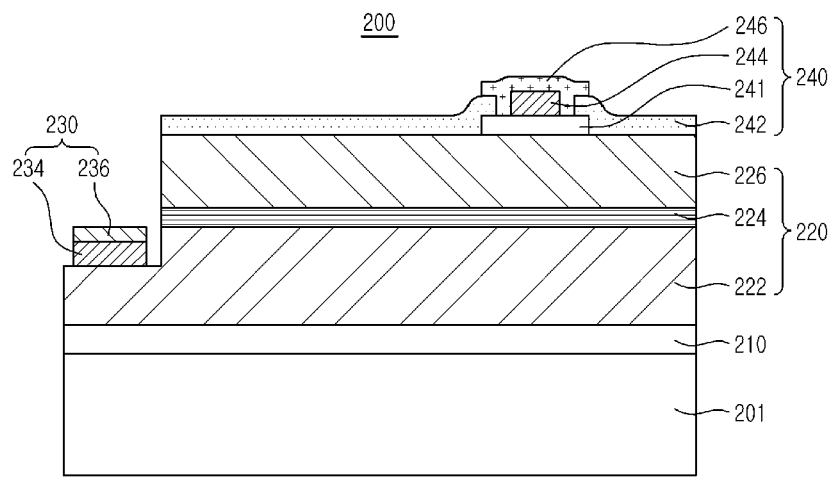

Thereafter, as illustrated in FIGS. 9A and 9B, an electrode portion 246 including the electrode pad portion 246P (see FIG. 5) and the electrode finger portion 246F (see FIG. 5) may be formed to cover the reflective pad portion 244P and the reflective finger portion 244F and disposed to be in contact with the transparent electrode layer 244. Also, a first electrode 230 including an electrode pad portion 236 and a reflective pad portion 234 may be formed. For example, the electrode pad portion 236 may be formed on the reflective pad portion 234 formed on the first conductivity-type semiconductor layer 222.

Through the forgoing processes, the semiconductor light emitting device 200 may be completed.

Figure 14:
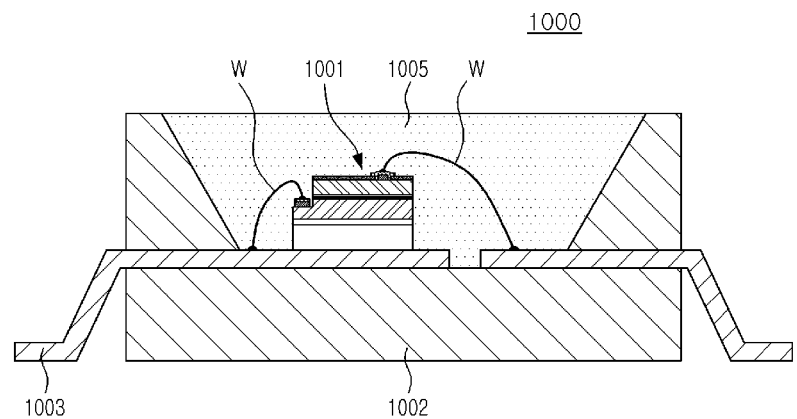
FIG. 14 is a cross-sectional view schematically illustrating a state in which a semiconductor light emitting device is mounted on a package according to an embodiment of the present inventive concept.

FIG. 14 illustrates an example of the semiconductor light emitting device 100 according to an embodiment of the present inventive concept applied to a package. A package 1000 illustrated in FIG. 14 may include a semiconductor light emitting device 1001, a package body 1002, and a pair of lead frames 1003. The semiconductor light emitting device 1001 may be mounted on the lead frame 1003 and electrically connected to the lead frame 1003 through wires W. Of course, the semiconductor light emitting device 1001 may be mounted on a region, e.g., on the package body 1002, rather than on the lead frames 1003. As illustrated in FIG. 14, the package body 1002 may have a cup-like shape in order to enhance light reflection efficiency. The reflective cup may be filled with a light-transmissive material 1005 to encapsulate the semiconductor light emitting device 1001, the wires W, and the like.

Figure 15:
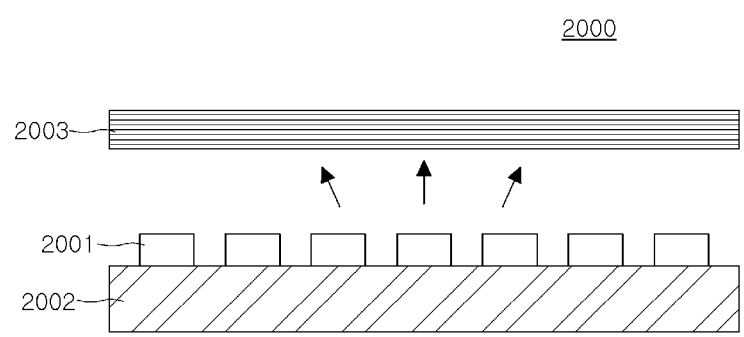
FIG. 15 is a cross-sectional view schematically illustrating an example of a backlight employing the package of FIG. 14.
Figure 16:
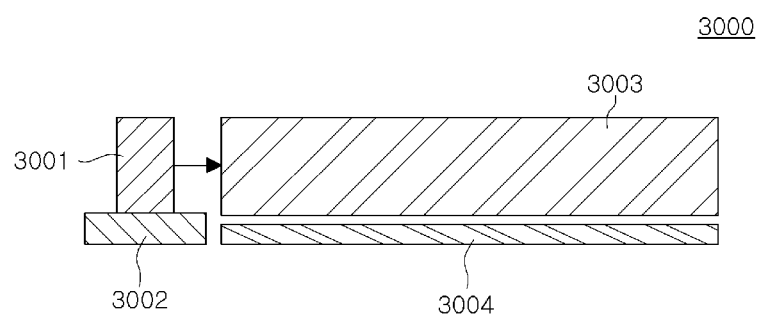
FIG. 16 is a cross-sectional view schematically illustrating another example of a backlight employing the package of FIG. 14.

FIGS. 15 and 16 are views illustrating an example in which a semiconductor light emitting device according to an embodiment of the present inventive concept is applied to a backlight unit. Referring to FIG. 15, in a backlight unit 2000, light sources 2001 may be mounted on a substrate 2002, and one or more optical sheets 2003 may be disposed thereabove. As the light sources 2001, a light emitting device package having the structure as described above or a similar structure may be used, or the semiconductor light emitting device may be mounted directly on the substrate 2002 (a so-called COB type) so as to be used. In the backlight unit 2000 illustrated in FIG. 15, the light sources 2001 may emit light upwardly where an LCD is disposed thereabove, but in comparison, in a backlight unit 3000 according to another example illustrated in FIG. 16, a light source 3001 mounted on a substrate 3002 may emit light in a lateral direction, and the emitted light may be made incident to a light guide plate 3003 so as to be changed into a surface light source. Light passing through the light guide plate 3003 may be emitted upwardly, and in order to enhance light extraction efficiency, a reflective portion 3004 may be disposed below the light guide plate 3003.

Figure 17:
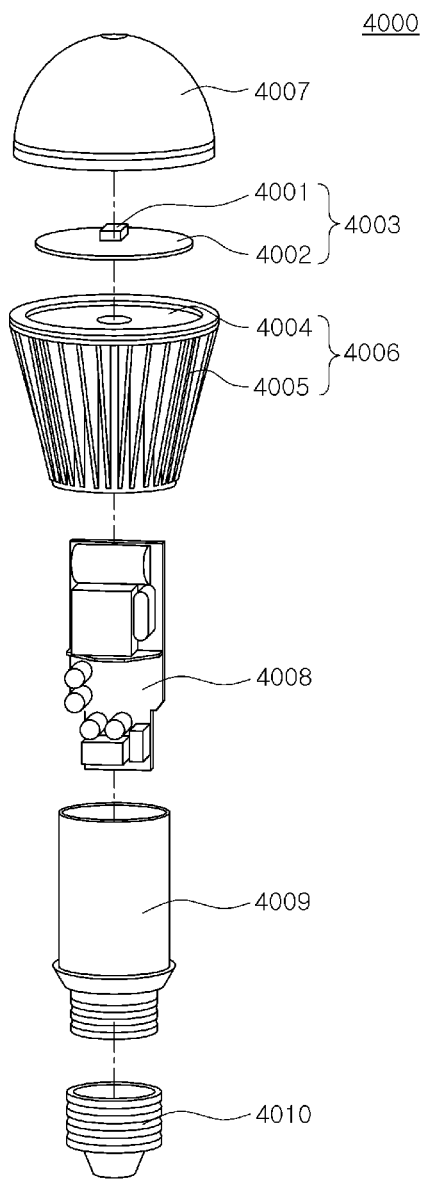
FIG. 17 is a view illustrating an example of applying a semiconductor light emitting device to a lighting device according to an embodiment of the present inventive concept.

FIG. 17 is a view illustrating an example in which a semiconductor light emitting device according to an embodiment of the present inventive concept is applied to a lighting device 4000.

Referring to the exploded perspective view of FIG. 17, a lighting device 4000 is illustrated as, for example, a bulb type lamp. The lighting device 4000 may include a light emitting module 4003, a driving unit 4008, and an external connection unit 4010. Also, the lighting device 4000 may further include external structures such as external and internal housings 4006 and 4009 and a cover unit 4007. The light emitting module 4003 may include a semiconductor light emitting device 4001 and a circuit board 4002 on which the light emitting device 4001 is mounted as described above. In an embodiment of the present inventive concept, a single semiconductor light emitting device 4001 may be mounted on the circuit board 4002, but the present inventive concept is not limited thereto and a plurality of semiconductor light emitting devices may be mounted as necessary. Also, rather than being directly mounted on the circuit board 4002, the semiconductor light emitting device 4001 may be manufactured in the form of a package and mounted.

In this case, the external housing 4006 may include a heat dissipation plate 4004 disposed to be in direct contact with the light emitting module 4003 to enhance a heat dissipation effect and include heat dissipation fins 4005 dissipating heat from the heat dissipation plate 4004 in the air. Also, the lighting device 4000 may include the cover unit 4007 installed on the light emitting module 4003 and having a convex lens shape. The driving unit 4008 may be installed in the internal housing 4009 and connected to the external connection unit 4010 having a socket structure to receive power from an external power source. Also, the driving unit 4008 may serve to convert received power into an appropriate current source for driving the semiconductor light emitting device 4001 of the light emitting module 4003 and provide the same. For example, the driving unit 4008 may be configured as an AC-DC converter, a rectifier circuit component, or the like.

Figure 18:
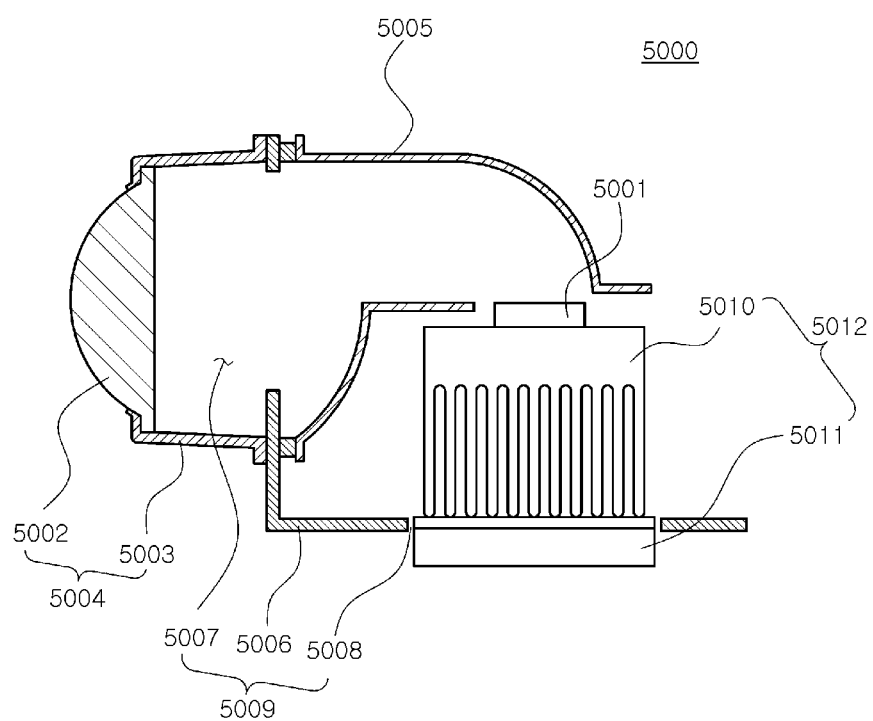
FIG. 18 is a view illustrating an example of applying a semiconductor light emitting device to a head lamp according to an embodiment of the present inventive concept.

FIG. 18 is a view illustrating an example in which a semiconductor light emitting device according to an embodiment of the present inventive concept is applied to a head lamp. Referring to FIG. 18, a head lamp 5000 used as a vehicle lamp, or the like, may include a light source 5001, a reflective unit 5005, and a lens cover unit 5004. The lens cover unit 5004 may include a hollow guide 5003 and a lens 5002. Also, the head lamp 5000 may further include a heat dissipation unit 5012 dissipating heat generated by the light source 5001 outwardly. In order to effectively dissipate heat, the heat dissipation unit 5012 may include a heat sink 5010 and a cooling fan 5011. Also, the head lamp 5000 may further include a housing 5009 fixedly supporting the heat dissipation unit 5012 and the reflective unit 5005, and the housing 5009 may have a central hole 5008 formed on one surface 5006 thereof, in which the heat dissipation unit 5012 is coupled. Also, the housing 5009 may have a front hole 5007 formed on another surface integrally connected to the one surface and bent from the one surface in a right angle direction. The front hole 5007 may allow the reflective unit 5005 to be fixedly positioned above the light source 5001. Accordingly, a front side may be opened by the reflective unit 5005, and the reflective unit 5005 may be fixed to the housing 5009 such that the opened front side corresponds to the front hole 5007, and light reflected by the reflective unit 5005 may pass through the front hole 5007 so as to be output outwardly.

As set forth above, according to embodiments of the inventive concept, light extraction efficiency of the present semiconductor light emitting device can be further enhanced.

While the present inventive concept has been shown and described in connection with the embodiments, it will be apparent to those skilled in the art that modifications and variations can be made without departing from the spirit and scope of the present inventive concept as defined by the appended claims.

What is claimed is:

1. A semiconductor light emitting device, comprising:
a light emitting structure including a first conductivity-type semiconductor layer, an active layer, and a second conductivity-type semiconductor layer sequentially laminated therein; and
first and second electrodes electrically connected to the first and second conductivity-type semiconductor layers, respectively,
wherein the second electrode comprises:
a reflective pad portion disposed in a region of an upper surface of the second conductivity-type semiconductor layer;
a transparent electrode layer disposed on the second conductivity-type semiconductor layer and having an opening encompassing the reflective pad portion such that the transparent electrode layer is not in contact with the reflective pad portion;
a reflective finger portion extending from the reflective pad portion and having at least
a portion thereof disposed on the transparent electrode layer; an electrode pad portion covering the reflective pad portion and disposed to be in contact with the transparent electrode layer; and
an electrode finger portion covering an upper surface of the reflective finger portion and disposed to be in contact with the transparent electrode layer,
wherein a metal layer is disposed at an interface between the reflective finger portion and the transparent electrode layer.

2. A semiconductor light emitting device, comprising:
a light emitting structure including a first conductivity-type semiconductor layer, an active layer, and a second conductivity-type semiconductor layer sequentially laminated therein; and
first and second electrodes electrically connected to the first and second conductivity-type semiconductor layers, respectively, wherein:
at least one of the first and second electrodes includes:
a reflective portion having a protrusion disposed on a portion of a lateral side of the reflective portion, and
a transparent electrode layer including an opening encompassing the reflective portion such that the transparent electrode layer is not in contact with the reflective portion, and
an inner circumferential surface of the transparent electrode layer defining the opening has an intaglio pattern having a shape corresponding to a shape of the protrusion.

3. The semiconductor light emitting device of claim 2, further comprising:
an electrode pad portion filling the opening to cover the reflective portion and having a region in contact with the transparent electrode layer.

4. The semiconductor light emitting device of claim 3, wherein electrode pad portion has fingers disposed in regions corresponding to the protrusion.

5. The semiconductor light emitting device of claim 2, wherein the intaglio pattern having the shape corresponding to the shape of the protrusion is repeatedly disposed on the inner circumferential surface of the opening and spaced apart from one another by a predetermined interval.

6. The semiconductor light emitting device of claim 2, wherein:
the protrusion is disposed on a side of the reflective portion, and
the protrusion includes a plurality of protrusions each having a trapezoidal shape, a saw tooth shape, a quadrangular shape, or a sine wave shape.

7. The semiconductor light emitting device of claim 6, wherein the protrusions of the reflective portion are radially disposed.

8. The semiconductor light emitting device of claim 7, wherein the protrusions are repeatedly disposed with a predetermined angle therebetween with respect to a central portion of the reflective portion.

* * * * *